United States Patent [19]

Curtis et al.

[11] Patent Number: 4,564,581

[45] Date of Patent: Jan. 14, 1986

[54] PROCESS OF PREPARING SCREEN STENCIL USING DIAZO PHOTOSENSITIVE COMPOSITIONS WITH ACIDIC P-H INDICATOR

[75] Inventors: John R. Curtis, Thanet; John D. Renwick, Ramsgate, both of England

[73] Assignee: Sericol Group Limited, London, England

[21] Appl. No.: 629,759

[22] Filed: Jul. 13, 1984

Related U.S. Application Data

[62] Division of Ser. No. 389,487, Jun. 17, 1982, abandoned.

[30] Foreign Application Priority Data

Jun. 19, 1981 [GB] United Kingdom ............... 8118929

[51] Int. Cl.$^4$ ............................................. G03F 7/12
[52] U.S. Cl. ..................................... 430/308; 430/175; 430/176; 430/177; 430/292; 430/294
[58] Field of Search .............. 430/308, 175, 176, 177, 430/191, 192, 193, 292, 294

[56] References Cited

U.S. PATENT DOCUMENTS

| | | | |
|---|---|---|---|
| 2,994,608 | 8/1961 | Schmidt et al. | 430/192 |
| 3,189,451 | 6/1965 | Reichel | 430/175 |
| 3,211,533 | 10/1965 | Ito | 430/175 |

FOREIGN PATENT DOCUMENTS

| | | | |
|---|---|---|---|
| 1039475 | 8/1966 | United Kingdom | 430/191 |
| 1041463 | 9/1966 | United Kingdom . | |
| 1170458 | 11/1969 | United Kingdom | 430/191 |
| 1378862 | 12/1974 | United Kingdom . | |

OTHER PUBLICATIONS

Lange, N. A., "Handbook of Chemistry", 8th ed., 1952, pp. 942-946.
Grant, J., "Hackh's Chemical Dictionary", 4th ed., 1969, pp. 344-345.

*Primary Examiner*—Charles L. Bowers, Jr.
*Attorney, Agent, or Firm*—Cushman, Darby & Cushman

[57] ABSTRACT

The invention provides photosensitive compositions useful in the production of screen printing stencils which comprise, in addition to the usual ingredients, also an indicator to show when a layer formed from the said composition has been isolubilized by exposure to actinic light.

3 Claims, No Drawings

PROCESS OF PREPARING SCREEN STENCIL USING DIAZO PHOTOSENSITIVE COMPOSITIONS WITH ACIDIC P-H INDICATOR

This is a division of application Ser. No. 389,487, filed June 17, 1982, now abandoned.

The present invention relates to compositions useful for the preparation of photosensitive layers for the production of screen printing stencils, and their use.

In screen printing, three methods of making stencils are used. In the first, the so-called "indirect method", a photosensitive composition is coated onto a suitable support, usually of a transparent polymer such as a polyester. The coated support is then irradiated with actinic light through a positive transparency after which, depending upon the type of photopolymerisation system used, the image obtained is either immediately developed with water or activated with a per compound and then developed with water. The wet image on the support is then transferred to the screen mesh by application of gentle even pressure, and, after drying, the support is removed to leave the photopolymerised image on the screen mesh ready for printing.

In the second system, the so-called "direct method", a water-soluble crosslinkable colloid is photosensitised with a suitable crosslinking agent activated by actinic light, for example a dichromate or a polymeric diazo salt, and then coated onto the screen mesh. The sensitised coated layer, after drying, is exposed to actinic light through a positive transparency to produce a latent image which is developed with water. The irradiated areas remain on the screen as they have been insolubilised, while the unirradiated areas, which are still water soluble, are washed away, to leave an image on the screen which, after drying, is ready for printing.

In the third system, the so-called "direct-indirect method", an unsensitised composition is coated onto a suitable support sheet, e.g. of a polyester. The screen mesh, suitably supported, e.g. by stretching on a frame, is placed on top of the unsensitised coating in good contact therewith. A photosensitive composition is then spread over the screen mesh and allowed to dry. This composition may be the same as that in the "direct method". The photosensitiser partially migrates into the unsensitised coating. When the photosensitive composition has completely dried, the support sheet is removed and the resultant assembly exposed to actinic light through a positive transparency. It is then developed with water in the same way as that described for the "direct system" to leave, after drying, an imaged screen ready for printing.

Known methods of producing stencil images by these methods have the disadvantage that, after the exposure to actinic light, it is difficult to see which areas have been exposed to light and which have not. Although many photochemical compositions will, by degradation of sensitizing agent or other component, show a slight colour change on exposure to UV light, the resulting contrast is generally insufficient for any use to be made of it. There is thus no satisfactory way of inspecting the image before it is developed, and it is difficult, where multiple exposures are used, to ensure exact registration between the different images. Thus if the exposure or the positioning of the photosensitive layer is incorrect, the fault cannot be detected until after the stencil image has been developed. It is clearly desirable, therefore, to provide a photosensitive composition for use in the production of screen printing stencils which is such that it is easy to see where areas have been exposed to actinic light, even before the stencil image has been developed.

According to the present invention, an aqueous photosensitive composition useful for making screen printing stencils comprises a water-soluble crosslinkable polymeric colloid, a diazonium salt as photosensitiser, and an acid base indicator, the pH of the composition being such that after a layer thereof has been exposed to light the hue of the indicator shifts from that of the acid or base form into that of the base or acid form respectively. The term "acid base indicator" as used herein means any compound the hue of which is noticeably changed by a change in pH over a narrow range, eg less than 3 units, and and usually less than 2 units. It will be understood that a change in hue involves significant shift in the wavelength of the absorption maximum in the visible spectrum. Such compounds are well known and are widely used in analytical applications. Examples of such indicators suitable for use in the present invention with the pH ranges over which they change hue are:

Metanil Yellow (pH 1.2–2.3), Bromophenol Blue (pH 3–4.6), Methyl Red (pH 4.4–6), Bromocresol Green (pH 3.8–5.4), Thymol Blue (pH 1.2–2.8), and Methyl Orange (pH 3.1–4.4).

Normally, the compositions of the present invention are adjusted, e.g. by addition of suitable buffering substances, to have a pH on the high side of and close to the pH range over which the indicator changes hue. Exposure of a dried layer of the composition then causes the hue of the indicator to shift from the base form to the acid form. The resulting change in the hue of the exposed layer is readily visible.

It is of course necessary to choose the indicator so that, having regard to the other components present in the composition, the change in hue which takes place is immediately visible. In particular, it is necessary to take into account the colour of the diazo salts used as photosensitiser. The presence of additional colouring substances in the composition may render the change in hue of the indicator itself either more or less conspicuous, and it is within the scope of the invention to include the compositions one or more further coloured materials which are not indicators in order to improve the visibility of the change in hue of the indicator itself. For example, a red colouring matter may be used to improve the appearance of the change in hue shown by Bromophenol Blue, or a blue colouring matter may be used to improve the visibility of the change in hue shown by Methyl Red.

It is generally convenient to use an indicator which changes hue within the pH range of 2 to 5, as the selection of the other ingredients of the new composition then presents no problem. The pH of the composition prior to coating may then be in the range 5 to 7.

The photosensitiser used in the compositions of the present invention may be any of the diazo photosensitisers which have heretofore been used in photosensitive compositions for making screen stencils. Condensation products of formaldehyde with a p-diazo diphenylamine salt are preferred. It is usual to supply such a photosensitiser separately from the remainder of the composition and to add it to the composition immediately before coating of the support sheet or stencil screen. The proportion used is normally 0.2 to 2.5% by weight of the composition, and preferably 0.4 to 1.2% by weight. The acidity of the diazo sensitizer must be taken into account in formulating the composition ready for coating.

Apart from the acid-base indicator, the remaining ingredients of the novel compositions are similar to those heretofore used in photosensitive compositions for making screen stencils. The preferred water-soluble crosslinkable polymer is polyvinyl alcohol which may be included in the composition in a proportion of 4 to 20%, and preferably 5 to 13% by weight. To improve the durability of the stencil obtained, it is usual to include a second polymeric material which is not necessarily water-soluble or crosslinkable and which may be dissolved or dispersed, for example polyvinyl acetate in a proportion of 0 to 60% by weight of the composition and preferably 20 to 40% by weight.

The compositions of the present invention contain water as the essential solvent in a proportion which is usually between 30 and 80% by weight and preferably 45 to 60% by weight. In order partly to improve the compatibility of the various ingredients of the composition and also to promote the flow-out of the compositions over the various types of mesh on which they may be used, one or more additional solvents may be included in minor proportion, e.g. up to 5% by weight. Examples of such additional solvents are 2-ethoxyethanol and other water miscible aliphatic solvents. When such additional solvents are used, a proportion of 0.1 to 2.5% by weight is normally all that is required.

In order further to improve the properties of the crosslinked polymer, and in particular its durability and/or flexibility in use, the compositions of the invention may contain one or more fillers such as starch in a proportion up to 20% by weight and preferably not more than 12% by weight and/or a plasticiser such as dibutyl phthalate in a proportion normally from 0.5 to 8% by weight and preferably 2 to 5% by weight based on the composition.

The indicator itself is only required in sufficient proportion to give a clearly detectable change in hue when exposure has taken place. A suitable proportion is normally from 0.03 to 0.3%, and preferably 0.06 to 0.15% by weight based on the composition. When additional colouring matters are present, the proportion may be up to 0.2% by weight, but is normally 0.02 to 0.12% when the addition of such a further colouring matter is considered desirable.

As already indicated, one or more buffering compounds may be included in the compositions to stabilise the pH to a value at which the dried layer is most sensitive to exposure by light. This does not normally require incorporation in the compositions of more than 4% by weight of suitable buffering compounds, and in most cases only 1 to 2% by weight of the buffering compounds is required. The normal kinds of buffers may be used, for example potassium sodium tartrate, trisodium or tripotassium citrate by itself or with a small amount of acetic acid, a combination of sodium acetate and acetic acid, or a combination of a sodium or potassium dihydrogen phosphate and a disodium or dipotassium hydrogen phosphate. In every case, of course, the exact nature of the buffering compounds and their amounts is chosen to provide a pH higher than but adjacent to the pH range over which the indicator changes hue.

The aforesaid novel compositions may be used in the indirect, direct and direct-indirect methods for producing screen printing stencils in place of previously known photosensitive compositions and in the same way, but with the important advantage that a dried layer of the new compositions shows clearly whether it has been exposed to actinic light, whether intentionally or by mistake, or not.

So far as we are aware, this desirable result has never previously been achieved, although British Specification No. 1041463 discloses light sensitive sheets, primarily for the preparation of lithographic plates, comprising a base sheet coated with a light sensitive layer comprising a diazo compound and an acid base indicator. These sheets are said to change colour upon exposure to light, but it is to be noted that the compositions described in this prior specification are based primarily on organic solvents and contain quite a different type of polymeric material.

The new compositions may be used in the same way as known photosensitive compositions useful for making screen printing stencils. The invention therefore includes within its scope:

1. A process for preparing a screen stencil by the indirect method which comprises coating a photosensitive composition of the invention onto a transparent, normally polymeric support, drying the coating, exposing the coating to actinic light via a positive transparency, developing the exposed coating, causing the developed coating to adhere to the screen mesh by pressure, drying the coating, and removing the support to produce a screen stencil.

2. A method for preparing a screen stencil by the direct method which comprises coating a photosensitive composition of the invention onto a screen mesh, drying the coating, exposing the dried coating to actinic light via a positive transparency, and developing and drying the exposed layer to produce a screen stencil.

3. A method for preparing a screen stencil by the direct-indirect method which comprises coating a photosensitive composition of the invention onto a screen mesh which is in direct contact with an unsensitised film in a support, drying the coating and removing the support, exposing the dried coating to actinic light via a positive transparency, and developing the exposed coating to produce a screen stencil.

The following are Examples of photosensitive compositions in accordance with the present invention. Parts are parts by weight.

EXAMPLE 1

|  | Parts |
| --- | --- |
| Gohsenol GH20 (a polyvinyl alcohol of high molecular weight, containing 12% residual acetate groups from Nippon Gohsei S.A.) | 7.7 |
| Vinamul 8440 (polyvinyl acetate emulsion having 54–56% solids content of Vinyl Products Limited) | 27 |
| Potassium Sodium tartrate | 2.25 |
| Bromophenol Blue Indicator | 0.04 |
| Dibutyl phthalate | 2.25 |
| 2-Ethoxyethanol | 1.5 |
| Water | to 100 |

The change in hue is from green (unexposed) to pale brown (exposed)

EXAMPLE 2

|  | Parts |
| --- | --- |
| Gohsenol GH20 | 5 |
| Emultex 328 (polyvinyl acetate | 53 |

-continued

| | Parts |
|---|---|
| emulsion of 56% solids content of Harco Limited) | |
| Tripotassium Citrate monohydrate | 3 |
| Acetic Acid | 0.4 |
| Bromophenol Blue Indicator | 0.1 |
| Methylated Spirit | 1 |
| Dibutyl phthalate | 3.4 |
| Imperon Red KB Paste (Hoechst) | 0.1 |
| Water | to 100 |

The change in hue is from green/black (unexposed) to dull pink (exposed).

EXAMPLE 3

| | |
|---|---|
| Gohsenol GH17 (a medium/high molecular weight polyvinyl alcohol containing approximately 12% residual acetate groups) | 15 |
| Rice Starch | 3.1 |
| Tripotassium citrate monohydrate | 1.6 |
| Bromocresol Green Indicator | 0.3 |
| 2-Ethoxyethanol | 2.6 |
| Dibutyl phthalate | 5.2 |
| Water | to 100 |

The change in hue is from bright green (unexposed) to buff (exposed)

EXAMPLE 4

| | Parts |
|---|---|
| Gohsenol KH17 (a medium/high molecular weight polyvinyl alcohol containing approximately 20% residual acetate groups) | 9.3 |
| Vinamul 8440 | 23 |
| Sodium Acetate | 1.2 |
| Thymol Blue Indicator | 0.3 |
| Dibutyl phthalate | 1.7 |
| Acetic Acid | 0.01 |
| Water | to 100 |

The change in hue is from yellow (unexposed) to red (exposed)

EXAMPLE 5

| | |
|---|---|
| Gohsenol GH20 | 8.5 |
| Vinamul 8440 | 33 |
| Potassium dihydrogen phosphate | 0.3 |
| Disodium hydrogen phosphate hydrate | 0.7 |
| Methyl Orange Indicator | 0.05 |
| Dibutyl phthalate | 2.2 |
| Water | to 100 |

The change in hue is from orange (unexposed) to red (exposed)

EXAMPLE 6

| | |
|---|---|
| Ertivinol 23/88 (a Polyvinyl alcohol of medium/high molecular weight containing 12% of residual acetate groups, from Union Explosivos Rio Tinto S.A.) | 15 |
| National 125-1033 (a polyvinyl acetate emulsion of 55% from National Adhesives and Resins Ltd.) | 8.5 |
| Tripotassium citrate monohydrate | 1.1 |
| Methyl Red | 0.1 |
| Dibutyl phthalate | 2 |
| Water | to 100 |

The change in hue of the sensitised layer of the composition is from orange (unexposed) to red (exposed).

EXAMPLE 7

| | Parts |
|---|---|
| Ertivinol 23/88 | 15 |
| Metanil Yellow | 0.2 |
| Methylated spirit | 2 |
| 2-Ethoxyethanol | 2.5 |
| Dibutyl phthalate | 5 |
| Bevaloid 691 M (a defoamer from Bevaloid Ltd.) | 0.1 |
| Water | to 100 |

The change in hue on exposure is from deep yellow (unexposed) to red-brown (exposed)

EXAMPLE 8

| | |
|---|---|
| Ertivinol 23/88 | 4.3 |
| Vinamul 8440 | 60 |
| Potassium sodium tartrate | 1.9 |
| Bromophenol Blue | 0.1 |
| Dibutyl phthalate | 2.6 |
| 2-Ethoxyethanol | 1.3 |
| Bevaloid 691 M | 0.1 |
| Water | to 100 |

The change in hue is from dark green (unexposed) to buff (exposed)

EXAMPLE 9

| | Parts |
|---|---|
| Gohsenol GH20 | 8.2 |
| National 225-1025 (a polyvinyl acetate emulsion of 55% solids content from National Adhesives and Resins Ltd.) | 30 |
| Tripotassium citrate monohydrate | 1.9 |
| Methyl Red | 0.4 |
| Dibutyl phthalate | 2.2 |
| 2-Ethoxyethanol | 1 |
| Unisperse Blue GE paste (a pigment paste from Ciba-Geigy) | 0.02 |
| Water | to 100 |

The change in hue is from yellow-brown (unexposed) to purple-pink (exposed).

EXAMPLE 10

| | |
|---|---|
| Ertivinol 23/88 | 9 |
| Vinamul 8440 | 36 |
| Sodium acetate | 0.8 |
| Acetic acid | 0.05 |
| Methyl Orange | 0.24 |
| Dibutyl phthalate | 4.8 |
| Methylated spirit | 2.4 |
| Water | to 100 |

The change in hue is from orange (unexposed) to brownish red (exposed)

EXAMPLE 11

| | |
|---|---|
| Ertivinol 23/88 | 10 |
| Harco 586 (a polyvinyl acetate emulsion of 60% solids from Harco Ltd.) | 33 |
| Bromocresol Green | 0.1 |
| Dibutyl phthalate | 4 |
| 2-Ethoxyethanol | 2 |
| Sodium acetate | 1 |
| Acetic acid | 0.05 |
| Water | to 100 |

The change in hue is from green (unexposed) to brown (exposed)

EXAMPLE 12

|  | Parts |
|---|---|
| Ertivinol 23/88 | 4.0 |
| Vinamul 8440 | 57 |
| Bromophenol Blue | 0.1 |
| Dibutyl phthalate | 2.5 |
| 2-Ethoxyethanol | 1.2 |
| Potassium sodium tartrate | 1.6 |
| Tapioca starch | 6 |
| Neopralac Golden Yellow (a pigment paste from PCUK) | 0.2 |
| Water | to 100 |

The change in hue is from green (unexposed) to yellow (exposed).

Each of the aforesaid compositions may be mixed, immediately before use, with a photosensitizer of known kind, e.g. 0.4 to 1.2% by weight of a condensation product of formaldehyde with a para-diazodiphenylamine salt, usually added in the form of a concentrated aqueous solution containing about 50% by weight of the said condensation product.

We claim:

1. A process for preparing a screen stencil by the indirect method which comprises coating a photosensitive composition onto a transparent support, drying the coating, exposing the coating to actinic light via a positive transparency, developing the exposed coating, causing the developed coating to adhere to the screen mesh by pressure, drying the coating, and removing the support to produce a screen stencil wherein the photosensitive composition comprises:
   25 to 53% by weight of film-forming polymers, including a water-soluble crosslinkable polymeric colloid;
   0.2 to 2.5% by weight of a diazo salt as photosensitizer;
   45 to 60% by weight of water;
   and 0.06 to 0.15% by weight of an indicator which changes substantially in hue over a pH range of less than 3 units within the range 1.2 to 6;
   the pH of the composition being maintained by a buffer on the high side of the pH range over which the indicator changes hue and such that, in a light sensitive layer formed from the said composition, the indicator has the hue characteristic of its base form, so that after a layer thereof has been exposed to light the hue of the indicator shifts from that in the base form into that of the acid form.

2. A method of preparing a screen stencil by the direct method which comprises coating a composition onto the screen mesh, drying the coating, exposing the dried coating to actinic light via a positive transparency, and developing and drying the exposed layer to produce a screen stencil, wherein the composition comprises:
   25 to 53% by weight of film-forming polymers, including a water-soluble crosslinkable polymeric colloid;
   0.2 to 2.5% by weight of a diazo salt as photosensitizer;
   45 to 60% by weight of water;
   and 0.06 to 0.15% by weight of an indicator which changes substantially in hue over a pH range of less than 3 units within the range 1.2 to 6;
   the pH of the composition being maintained by a buffer on the high side of the pH range over which the indicator changes hue and such that, in a light sensitive layer formed from the said composition, the indicator has the hue characteristic of its base form, so that after a layer thereof has been exposed to light the hue of the indicator shifts from that in the base form into that of the acid form.

3. A method of preparing a screen stencil by the direct-indirect method which comprises coating a composition onto a screen mesh in direct contact with an unsensitised film on a support, drying the coating, removing the support, exposing the dried coating to actinic light via a positive transparency, and developing the exposed coating to produce a screen stencil, wherein the composition comprises:
   25 to 53% by weight of film-forming polymers, including a water-soluble crosslinkable polymeric colloid;
   0.2 to 2.5% by weight of a diazo salt as photosensitizer;
   45 to 60% by weight of water;
   and 0.06 to 0.15% by weight of an indicator which changes substantially in hue over a pH range of less than 3 units within the range 1.2 to 6;
   the pH of the composition being maintained by a buffer on the high side of the pH range over which the indicator changes hue and such that, in a light sensitive layer formed from the said composition, the indicator has the hue characteristic of its base form, so that after a layer thereof has been exposed to light the hue of the indicator shifts from that in the base form into that of the acid form.

* * * * *